(12) United States Patent
Iizuka

(10) Patent No.: US 11,414,754 B2
(45) Date of Patent: Aug. 16, 2022

(54) FILM FORMING APPARATUS

(71) Applicant: Tokyo Electron Limited, Tokyo (JP)

(72) Inventor: Hachishiro Iizuka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/264,208

(22) PCT Filed: Jul. 19, 2019

(86) PCT No.: PCT/JP2019/028419
§ 371 (c)(1),
(2) Date: Jan. 28, 2021

(87) PCT Pub. No.: WO2020/026845
PCT Pub. Date: Feb. 6, 2020

(65) Prior Publication Data
US 2021/0301398 A1 Sep. 30, 2021

(30) Foreign Application Priority Data
Aug. 2, 2018 (JP) .............................. JP2018-146001

(51) Int. Cl.
| C23C 16/40 | (2006.01) |
| C23C 16/448 | (2006.01) |
| C23C 16/455 | (2006.01) |
| C23C 16/458 | (2006.01) |
| C23C 16/52 | (2006.01) |

(52) U.S. Cl.
CPC .......... *C23C 16/448* (2013.01); *C23C 16/455* (2013.01); *C23C 16/4583* (2013.01); *C23C 16/52* (2013.01)

(58) Field of Classification Search
CPC .......... C23C 16/4487; C23C 16/45512; C23C 16/45523; C23C 16/45525; C23C 16/45561; C23C 16/52; C23C 16/448; C23C 16/4481; C23C 14/24; C23C 14/243; C23C 14/246; C23C 14/26; C23C 14/28; C23C 16/4482; C23C 16/4485; H01L 21/02271; H01L 21/67017
USPC ..................................... 118/726; 156/345.37
See application file for complete search history.

(56) References Cited

U.S. PATENT DOCUMENTS

| 6,409,837 B1 | 6/2002 | Hillman |
| 6,596,085 B1 * | 7/2003 | Schmitt ............... C23C 16/4486 118/726 |

FOREIGN PATENT DOCUMENTS

| JP | 07-273052 A | 10/1995 |
| JP | 10-46343 A | 2/1998 |
| JP | 2002-535483 A | 10/2002 |

(Continued)

OTHER PUBLICATIONS

International Search Report for PCT/JP2019/028419, dated Oct. 15, 2019, 2 pages.

*Primary Examiner* — Rudy Zervigon
(74) *Attorney, Agent, or Firm* — Armstrong Teasdale LLP

(57) ABSTRACT

A film forming apparatus includes: a stage on which a workpiece on which a film is to be formed is placed; a gas supply part provided so as to face the stage, including a heater provided to be controlled to a predetermined temperature, and configured to supply a carrier gas; and a vaporization part provided between the stage and the gas supply part, and configured to be heated by heat generated from the gas supply part to vaporize a film-formation material supplied in a liquid state.

6 Claims, 13 Drawing Sheets

(56) References Cited

FOREIGN PATENT DOCUMENTS

| JP | 2017-504725 A | 2/2017 |
|----|---------------|--------|
| WO | 2017189135 A1 | 11/2017 |

* cited by examiner

FILM FORMING APPARATUS

CROSS-REFERENCE TO RELATED APPLICATIONS

This application is a National Stage Application of International Patent Application No. PCT/JP2019/028419, having an International Filing Date of Jul. 19, 2019, which claims the benefit of priority to Japanese Patent Application No. 2018-146001, filed Aug. 2, 2018, the entire contents of each of which are hereby incorporated by reference herein.

TECHNICAL FIELD

The present disclosure relates to a film forming apparatus.

BACKGROUND

Patent Document 1 discloses a technique for vaporizing a liquid film-formation material used for film formation by a vaporizer, and transferring the vaporized film-formation material gas to a shower head together with a carrier gas to be injected to a substrate, thus forming a film on the substrate.

PRIOR ART DOCUMENTS

Patent Documents

Patent Document 1: International publication No. 2017-189135

SUMMARY

The present disclosure provides some embodiments of a technique capable of forming a film by vaporizing a liquid film-formation material at a position closer to a workpiece.

A film forming apparatus according to one aspect of the present disclosure includes a stage, a gas supply part, and a vaporization part. The stage places a workpiece on which a film is to be formed thereon. The gas supply part is provided so as to face the stage, has a heater provided to be controlled to a predetermined temperature, and supplies a carrier gas. The vaporization part is provided between the stage and the gas supply part, and is heated by heat generated from the gas supply part to vaporize a film-formation material supplied in a liquid state.

According to the present disclosure, it is possible to form a film by vaporizing a liquid film-formation material at a position closer to a workpiece.

DETAILED DESCRIPTION

An embodiment of a film forming apparatus disclosed herein will now be described in detail with reference to the drawings. It should be noted that the disclosed film forming apparatus is not limited by the present embodiment.

In the film forming apparatus, when a film-formation material gas vaporized by a vaporizer is transferred to a shower head, a pipe for transferring the film-formation material gas and a heating means such as a heater for keeping the film-formation material gas in a vaporized state are necessary. In addition, the pipe requires a complicated configuration and control, such as having a path for discharging liquid that did not vaporize before being introduced into the shower head. Therefore, a technique capable of vaporizing the liquid film-formation material at a position closer to a substrate to form a film is needed.

[Configuration of the Film Forming Apparatus]

Figure 1:
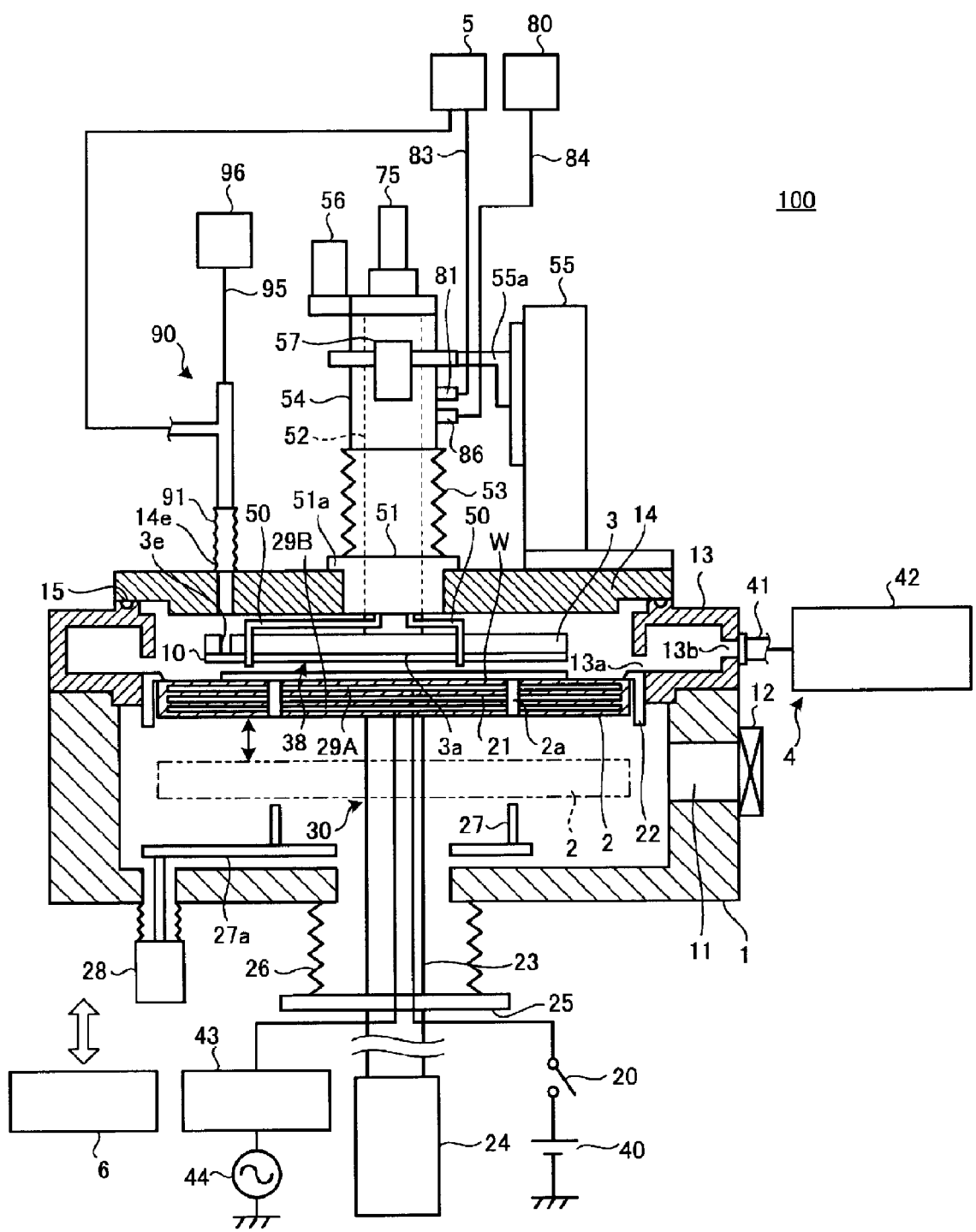
FIG. 1 is a cross-sectional view illustrating an example of a schematic configuration of a film forming apparatus according to an embodiment of the present disclosure.

Next, a configuration of a film forming apparatus according to an embodiment of the present disclosure will be described. The film forming apparatus is an apparatus for forming a film on a workpiece on which a film is to be formed. Hereinafter, a case where the film forming apparatus forms a film on a semiconductor wafer (hereinafter, also referred to as a "wafer") as the workpiece will be described as an example. FIG. 1 is a cross-sectional view illustrating an example of a schematic configuration of the film forming apparatus according to an embodiment of the present disclosure. A film forming apparatus 100 includes a process vessel 1, a stage 2, a gas supply part 3, an exhaust part 4, a gas source 5, and a controller 6.

The process vessel 1 is made of metal such as aluminum or the like, and has a substantially cylindrical shape.

A loading/unloading port 11 for loading or unloading the wafer W therethrough is formed on a sidewall of the process vessel 1. The loading/unloading port 11 is opened and closed by a gate valve 12. An annular exhaust duct 13 having a rectangular cross section is provided on a main body of the process vessel 1. A slit 13a is formed in the exhaust duct 13 along its inner peripheral surface. An exhaust port 13b is formed on an outer wall of the exhaust duct 13. A flat ceiling member 14 is provided on an upper surface of the exhaust duct 13 so as to close an upper opening portion of the process vessel 1. The ceiling member 14 is made of metal such as aluminum like the process vessel 1. A space between the exhaust duct 13 and the ceiling member 14 is airtightly sealed with a seal 15.

The stage 2 horizontally supports the wafer W inside the process vessel 1. The stage 2 is formed in a disc shape larger than the wafer W, and is supported by a support member 23. The stage 2 is made of a ceramic material such as aluminum nitride (AlN) or a metallic material such as aluminum or nickel alloy, and includes a heater 21 for heating the wafer W, an electrostatic adsorption electrode 29A and a high frequency electrode 29B embedded therein. The heater 21 is supplied with electric power from a heater power supply (not shown) to generate heat. Furthermore, the output of the heater 21 is controlled by a temperature signal of a fiber thermometer (not shown) provided near the upper surface of the stage 2, thereby controlling the wafer W to a predetermined temperature.

A high frequency power supply 44 is connected to the high frequency electrode 29B via a matching device 43. The matching device 43 has a variable capacitor and an impedance control circuit, and can control at least one of capacitance and impedance. The matching device 43 matches a load impedance with an internal impedance of the high frequency power supply 44. The high frequency power supply 44 applies electric power of a predetermined frequency for ion drawing of plasma to the stage 2 via the high frequency electrode 29B. For example, the high frequency power supply 44 applies a high frequency power of 13.56 MHz for ion drawing to the stage 2 via the high frequency electrode 29B. In this manner, the stage 2 also functions as a lower electrode.

The electrostatic adsorption electrode 29A is connected to an adsorption power supply 40 via an ON/OFF switch 20 arranged outside the process vessel 1 so that a predetermined DC voltage is applied from the adsorption power supply 40 to the electrostatic adsorption electrode 29A. The electrostatic adsorption electrode 29A adsorbs the wafer W by virtue of a Coulomb force generated by the application of the DC voltage.

The gas supply part 3 is arranged above the stage 2 so as to face the stage 2. The gas supply part 3 has a disc-like shape similar to that of the wafer W. Various kinds of gases used for film formation are supplied to the gas supply part 3 via a gas flow path to be described later. The gas supply part 3 supplies the various gases supplied thereto into the process vessel 1.

A vaporization part for vaporizing the supplied liquid film-formation material is arranged between the stage 2 and the gas supply part 3. In the present embodiment, the vaporization part will be referred to as a substrate for vaporization (hereinafter, also referred to as a "vaporization substrate") 10 having the same shape as the wafer W. Since the vaporization substrate 10 has the same shape as the wafer W, it can be transferred into the process vessel 1 from the loading/unloading port 11 by a transfer mechanism, such as a robot arm or the like, which transfers the wafer W. The vaporization substrate 10 is arranged between the stage 2 and the gas supply part 3.

A support part which detachably supports the vaporization substrate 10 to the gas supply part 3 is provided in the film forming apparatus 100. For example, support pins 50 are provided as the support part in the gas supply part 3 around the vaporization substrate 10. A plurality of support pins 50 are provided around an inner half of the vaporization substrate 10 opposite to the side of the loading/unloading port 11 so that the vaporization substrate 10 transferred from the loading/unloading port 11 can enter the side of a lower surface 3a of the gas supply part 3. For example, three support pins 50 are provided at positions which are set to 90 degrees, 180 degrees, and 270 degrees in the directions with respect to the center of the gas supply part 3 when the direction of the loading/unloading port 11 is set to 0 degrees with respect to the center of the gas supply part 3. Lower leading end portions of the support pins 50 are formed to be bent in an L shape toward the center side of the gas supply part 3, in which the leading end portions go around the lower surface of the vaporization substrate 10 entering from the side of the loading/unloading port 11 to support the vaporization substrate 10. The support pins 50, which can be raised and lowered by an elevating mechanism 57 to be described later, rise while supporting the vaporization substrate 10 to bring the vaporization substrate 10 into contact with the gas supply part 3 to be fixed to the gas supply part 3.

A circular opening is formed in the ceiling member 14 near its center, and an opening member 51 is provided to fit the opening. A flange portion 51a whose upper side is wider than the opening is provided in the opening member 51. A space between the flange portion 51a and the ceiling member 14 is airtightly sealed by a sealing member such as a seal or the like.

A cylindrical shaft 52 is arranged in the opening member 51. A lower end of the shaft 52 is fixed to the center of the gas supply part 3. An extensible bellows 53 is provided in an upper portion of the opening member 51. A tubular housing 54 is provided in an upper portion of the bellows 53. The shaft 52 passes through the bellows 53 and extends up to the upper portion of the housing 54. The shaft 52 is rotatably supported by the housing 54 in a circumferential direction.

An elevating mechanism 55 which raises and lowers the gas supply part 3 is provided in the film forming apparatus 100. In the present embodiment, the elevating mechanism 55 is provided on an upper surface of the ceiling member 14. An arm 55a is provided in the elevating mechanism 55. The arm 55a is fixed to the housing 54 to support the housing 54. The elevating mechanism 55 incorporates an actuator such as a motor or the like, and can move the arm 55a up and down by a driving force of the actuator. As the arm 55a moves up and down, the housing 54 moves up and down. As the housing 54 moves up and down, the shaft 52 also moves up and down. As the shaft 52 moves up and down, the gas supply part 3 moves up and down inside the process vessel 1.

In addition, a rotary mechanism 56 configured to rotate the gas supply part 3 with a rotary shaft perpendicular to the gas supply part 3 is provided in the film forming apparatus 100. In the present embodiment, the rotary mechanism 56 is provided in the housing 54. The rotary mechanism 56 incorporates a motor and rotates the shaft 52 inside the housing 54 in the circumferential direction by virtue of a driving force of the motor. As the shaft 52 rotates in the circumferential direction, the gas supply part 3 rotates around the shaft 52 as the rotary shaft.

Furthermore, the elevating mechanism 57 which raises and lowers the support pins 50 is provided in the film forming apparatus 100.

Figure 2A:
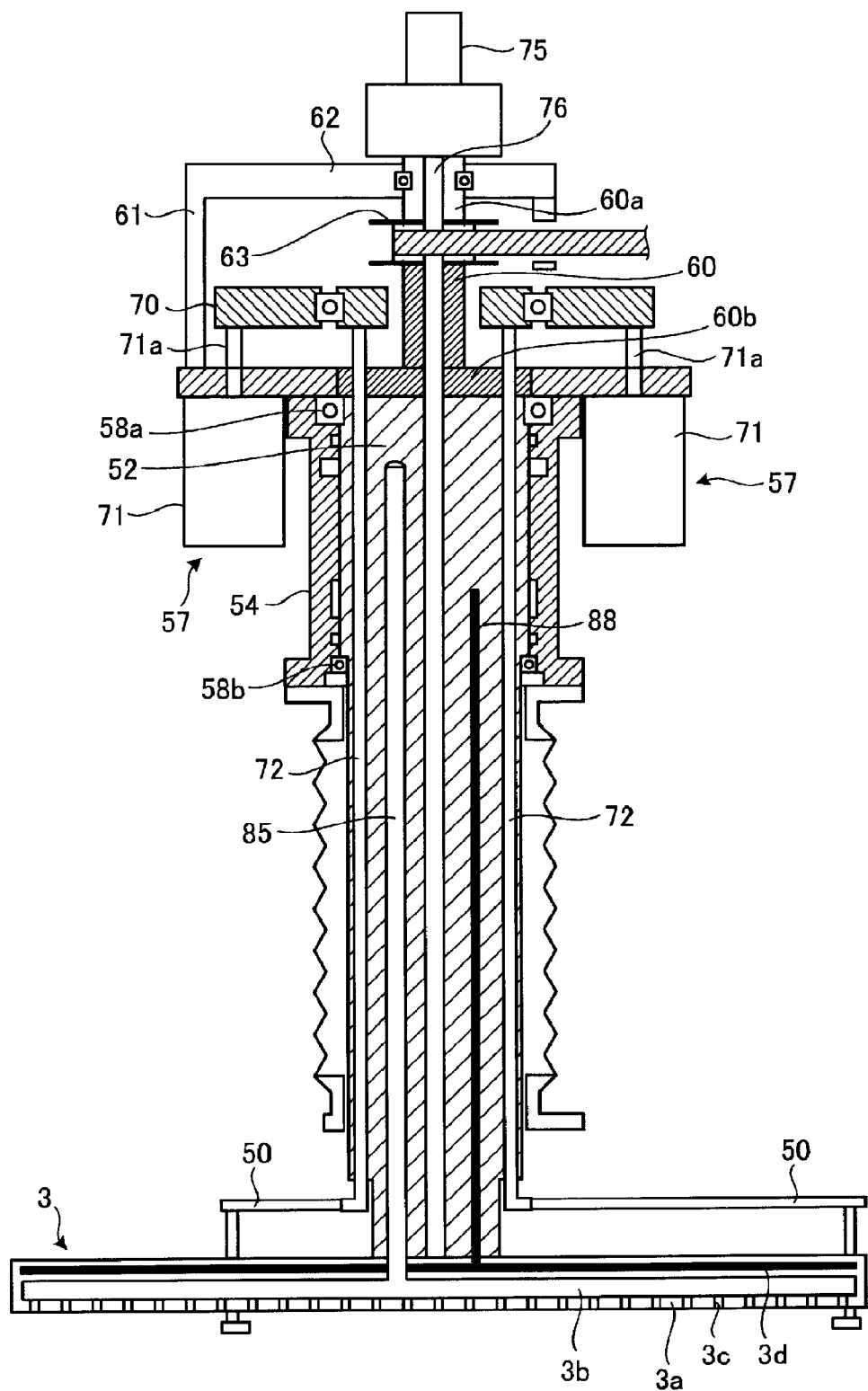
FIG. 2A is a cross-sectional view illustrating an example of a detailed configuration of the film forming apparatus according to an embodiment of the present disclosure.
Figure 2B:
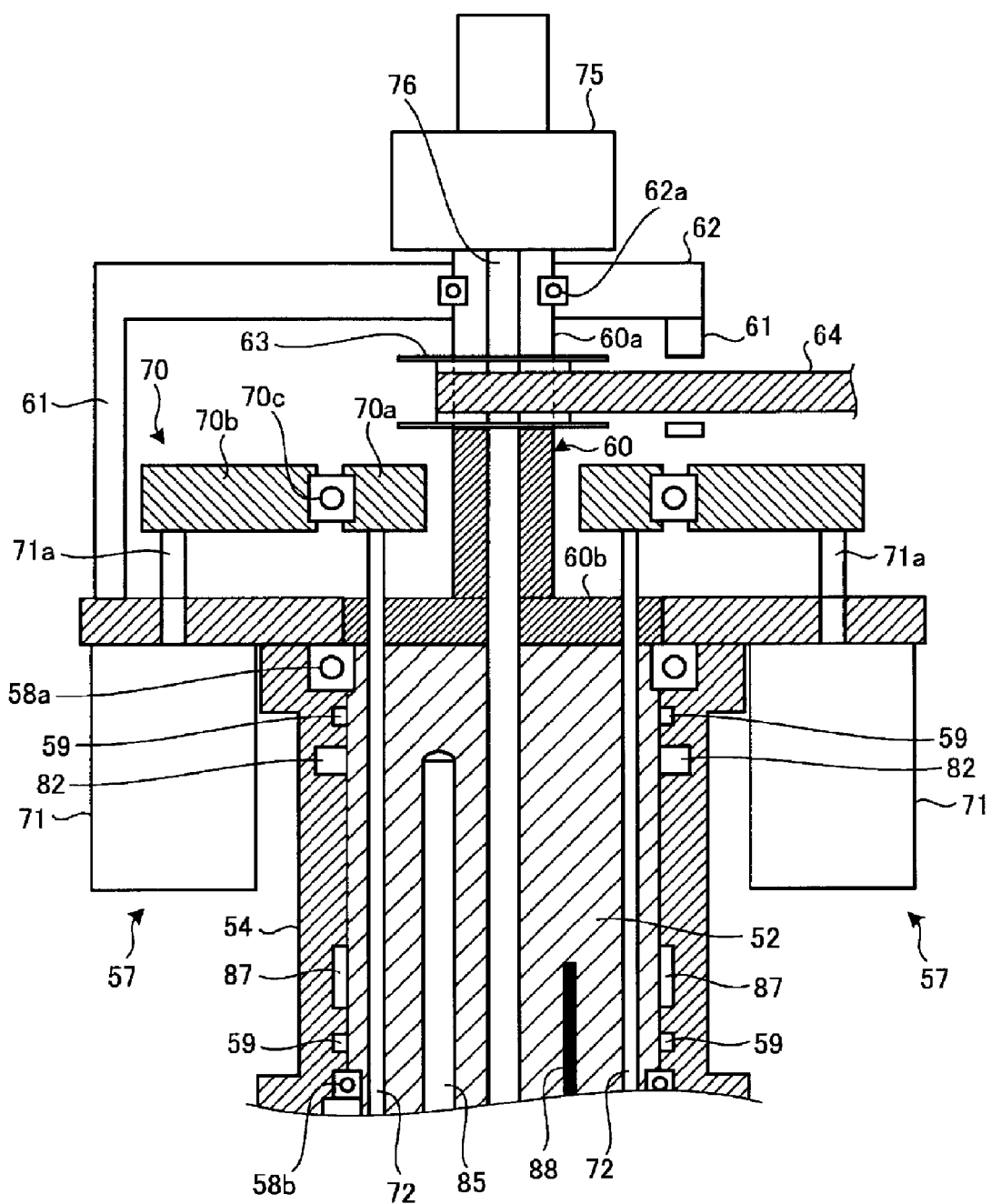
FIG. 2B is an enlarged view of a portion of FIG. 2A.

FIG. 2A is a cross-sectional view illustrating an example of a detailed configuration of the film forming apparatus according to an embodiment of the present disclosure. FIG. 2A is a cross-sectional view illustrating an example of a detailed configuration of the vicinity of the upper portion of the film forming apparatus 100 when viewing the film forming apparatus 100 at a position changed by 90 degrees in FIG. 1. A detailed configuration of the vicinity of the gas supply part 3, the housing 54, the rotary mechanism 56, and the elevating mechanism 57 is illustrated in FIG. 2A. FIG. 2B is an enlarged view of a portion of FIG. 2A.

As illustrated in FIG. 2A, the shaft 52 is fixed to the center of the gas supply part 3. The shaft 52 passes through the bellows 53 and reaches the inside of the housing 54. Bearings 58a and 58b are provided on an inner peripheral surface of the housing 54 while being vertically separated from each other. The shaft 52 is rotatably supported by the bearings 58a and 58b. A lower portion of the bearing 58a and an upper portion of the bearing 58b are airtightly sealed with seals 59, respectively.

An upper shaft member 60 is provided in the upper portion of the shaft 52. A columnar portion 60a having a diameter smaller than that of the shaft 52 is formed on the upper shaft member 60, and a flange portion 60b having the same diameter as the shaft 52 is formed in a lower portion of the upper shaft member 60. In the upper shaft member 60, the flange portion 60b is fixed to the shaft 52 so that the shaft 52 and the upper shaft member 60 coaxially rotate.

The periphery of the upper shaft member 60 is covered with a cylindrical cover 61. A disk-shaped cover 62 is provided on an upper surface of the cover 61. A bearing 62a rotatably supporting the upper shaft member 60 is provided in the cover 62. The upper end of the upper shaft member 60 is exposed to the center of the cover 62.

A pulley 63 is fixed to the upper shaft member 60. A belt 64 extends to engage with the pulley 63. In the cover 61, an opening is formed at a portion through which the belt 64 passes. The belt 64 is rotated by the driving force of the motor provided in the rotary mechanism 56. By the rotation of the belt 64, the pulley 63 rotates, and the upper shaft member 60 and the shaft 52 also rotates.

Elevating components 70 are provided in the upper shaft member 60. Holder portions 70b are provided around disk members 70a of the elevating components 70, in which the disk members 70a are rotatably supported by the holder portions 70b via bearings 70c. The disk members 70a each have a through-hole having a diameter larger than that of the upper shaft member 60 formed at its center, and the upper shaft member 60 is arranged in the through-hole. The disk members 70a can rotate in the circumferential direction as rotors via the bearings 70c. The holder portions 70b support the disk members 70a as stators without rotating via the bearings 70c.

Two cylinders 71 are provided in the upper portion of the housing 54 as the elevating mechanism 57 at symmetrical positions with the upper shaft member 60 interposed therebetween. The cylinders 71 each incorporate an actuator such as a motor or the like, and can expand and contract rods 71a by a driving force of the actuator. The holder portions 70b are formed with extension portions which partially extend in the direction of the cylinders 71, in which the rods 71a of the cylinders 71 are connected to the extension portions. In the cover 61, an opening is formed in a portion through which the extension portions of the holder portions 70b pass. The cylinders 71 expand and contract the rods 71a by the driving force of the actuator so as to raise and lower the holder portions 70b. As the holder portions 70b move up and down, the disk members 70a move up and down in the direction of the rotary shaft of the upper shaft member 60.

Through-holes are formed in the shaft 52 and the upper shaft member 60 in the direction of the rotary shaft at positions deviated from the rotary shaft, and poles 72 are arranged in the through-holes. Upper ends of the poles 72 are connected to the disk members 70a, and lower ends thereof are connected to the support pins 50. The poles 72 rotate together with the shaft 52 according to the rotation of the shaft 52. When the poles 72 rotate together with the shaft 52, the disk members 70a connected to the upper ends of the poles 72 receive a rotational force via the poles 72 and rotate together with the poles 72 and the shaft 52. That is, the disk members 70a, the poles 72, and the shaft 52 rotate together as a unit. Furthermore, the poles 72 move in the direction of the rotary shaft inside the through-holes as the upper shaft member 60 moves up and down, and raises and lowers the support pins 50. In this manner, the support pins 50 are raised and lowered via the upper shaft member 60 and the poles 72 by expanding and contracting the rods 71a of the cylinders 71. The shaft 52 is formed to have a small diameter at its lower portion so that the connection portions between the poles 72 and the support pins 50 do not interfere with the shaft 52 even when the connection portions move up and down. The connection portion between the poles 72 and the support pins 50 are exposed to the outside of the shaft 52.

A fiber thermometer 75 is provided above the upper shaft member 60. In addition, through-holes are formed in the shaft 52 and the upper shaft member 60 in the direction of the rotary shaft in the central portion serving as the rotary shaft. An optical fiber 76 is provided in the through-holes. An upper end of the optical fiber 76 is connected to the fiber thermometer 75, and a lower end thereof reaches the gas supply part 3. The fiber thermometer 75 measures a temperature of the gas supply part 3 based on an optical signal input from the optical fiber 76.

As illustrated in FIG. 1, a gas supply port 81 is provided on an outer peripheral surface of the housing 54. The supply port 81 is connected to a gas source 5 via a gas pipe 83 so as to receive a gas from the gas source 5. For example, a purge gas is supplied from the gas source 5 to the supply port 81. As illustrated in FIG. 2B, the housing 54 has recess 82 formed along the circumferential direction at a position corresponding to the supply port 81 on its inner peripheral surface. The supply port 81 penetrates to the recess 82 formed on the inner peripheral surface of the housing 54.

A gas flow path 85 is formed in the shaft 52 in the direction of the rotary shaft. One lower end of the gas flow path 85 reaches the gas supply part 3, and the other upper end of the gas flow path 85 changes its orientation in a radial direction at the height of the recess 82 and reaches the peripheral surface facing the recess 82.

The gas supply part 3 has a gas flow path 3b formed therein and communicates with the gas flow path 85. The gas supply part 3 is configured as a shower head in which a plurality of injection holes 3c communicating with the gas flow path 3b are formed on its lower surface 3a.

The gas supplied to the supply port 81 flows through the recess 82. The recess 82 is formed along the inner peripheral surface of the housing 54 in the circumferential direction. Therefore, even when the shaft 52 is rotating, the other end of the gas flow path 85 is in communication with the recess 82 and the gas in the recess 82 flows through the gas flow path 85. The gas flowing through the gas flow path 85 flows through the gas flow path 3b inside the gas supply part 3 and is injected from each of the injection holes 3c of the gas supply part 3.

Furthermore, as illustrated in FIG. 1, a power feeding terminal 86 is provided in the housing 54. The power feeding terminal 86 is connected to a heater power supply 80 via a power supply line 84, and receives electric power from the heater power supply 80. As illustrated in FIG. 2B, a conductive part 87 is provided in the housing 54 along the circumferential direction at a position corresponding to the power feeding terminal 86 on the inner peripheral surface. The power feeding terminal 86 is connected to the conductive part 87 via a power feeding wire (not shown).

A power feeding wire 88 is provided in the shaft 52 in the direction of the rotary shaft. A lower end of the power feeding wire 88 reaches the gas supply part 3, an upper end of the power feeding wire 88 changes its orientation in the radial direction around the position of the conductive part 87, reaches the peripheral surface facing the conductive part 87, and is brought into contact with the conductive part 87 to be electrically conductive with the conductive part 87.

A heater 3d is provided inside the gas supply part 3, and the power feeding wire 88 is connected to the heater 3d.

The power supplied to the power feeding terminal 86 flows through the conductive part 87. The conductive part 87 is formed along the inner peripheral surface of the housing 54 in the circumferential direction. Therefore, even when the shaft 52 is rotating, the other end of the power feeding wire 88 is in a conductive state with the conductive part 87. The power supplied to the power feeding terminal 86 is supplied to the heater 3d inside the gas supply part 3 via the conductive part 87 and the power feeding wire 88. The heater 3d generates heat according to the supplied power to heat the gas supply part 3.

The vaporization substrate 10 supported by the support pins 50 is arranged on the lower surface 3a of the gas supply part 3.

Figure 3:
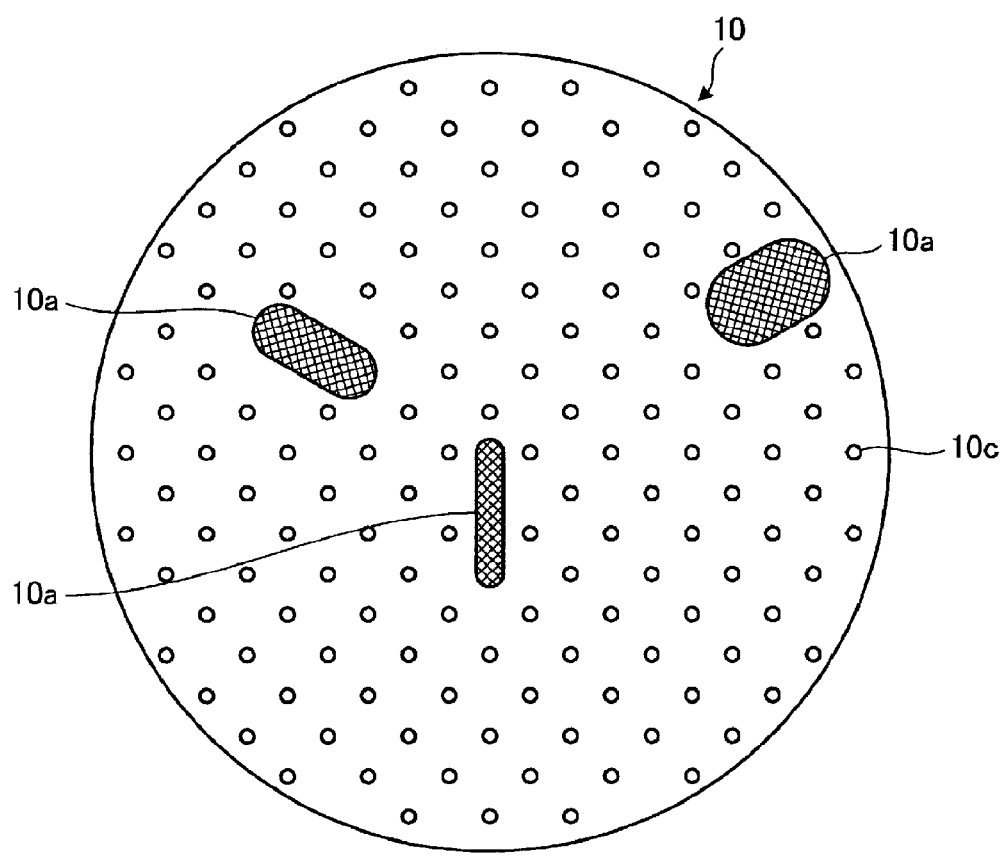
FIG. 3 is a cross-sectional view illustrating an example of a detailed configuration of a vaporization substrate according to an embodiment of the present disclosure.

FIG. 3 is a cross-sectional view illustrating an example of a detailed configuration of the vaporization substrate according to an embodiment of the present disclosure. The vaporization substrate 10 has a disk-like shape similar to the wafer W, and is made of, for example, metal having high thermal conductivity, such as aluminum or the like. In addition, storage parts 10a are provided in the vaporization substrate 10. Each storage part 10a is made of, for example, a sintered metal, a nylon filter, a porous member, a porous metal or the like, and can store the liquid film-formation material. The storage parts 10a are arranged so that the distribution of the material is likely to be uniform during film formation. For example, the vaporization substrate 10 illustrated in FIG. 3 is divided into three regions having a center portion, a middle portion, and an outer peripheral portion in the radial direction from the center of the disk-shaped surface. The storage parts 10a are stored in the respective regions with sizes corresponding to the area ratios of the respective regions.

Furthermore, through-holes 10c are formed in the vaporization substrate 10 at positions corresponding to the respective injection holes 3c of the gas supply part 3. A gas injected from each injection hole 3c of the gas supply part 3 passes through the respective through-hole 10c and is supplied into the process vessel 1.

Returning to FIG. 1, a supply mechanism 90 configured to supply the liquid film-formation material to the storage parts 10a of the vaporization substrate 10 is provided in the film forming apparatus 100. The supply mechanism 90 is provided for each storage part 10a of the vaporization substrate 10, but only one supply mechanism 90 is illustrated in FIG. 1. The supply mechanism 90 is arranged at a position above the storage part 10a of the vaporization substrate 10.

A through-hole 3e is formed in the gas supply part 3 at a position corresponding to the storage part 10a. In addition, a through-hole 14e is formed in the ceiling member 14 at a position above the through-hole 3e.

An extensible bellows 91 is provided in a lower portion of the supply mechanism 90, and is arranged in the upper portion of the through-hole 14e. The supply mechanism 90 is configured to be raised and lowered by an elevating mechanism (not shown).

The supply mechanism 90 is branched at the upstream side, in which the liquid film-formation material is supplied from one branched side, and the purge gas is supplied from the other branched side. When the supply mechanism 90 supplies the liquid film-formation material to the storage part 10a of the vaporization substrate 10, it is lowered to its lower portion by the elevating mechanism (not shown) so that the leading end thereof reaches the storage part 10a and the liquid film-formation material is supplied from the leading end to the storage part 10a together with the purge gas.

Figure 4A:
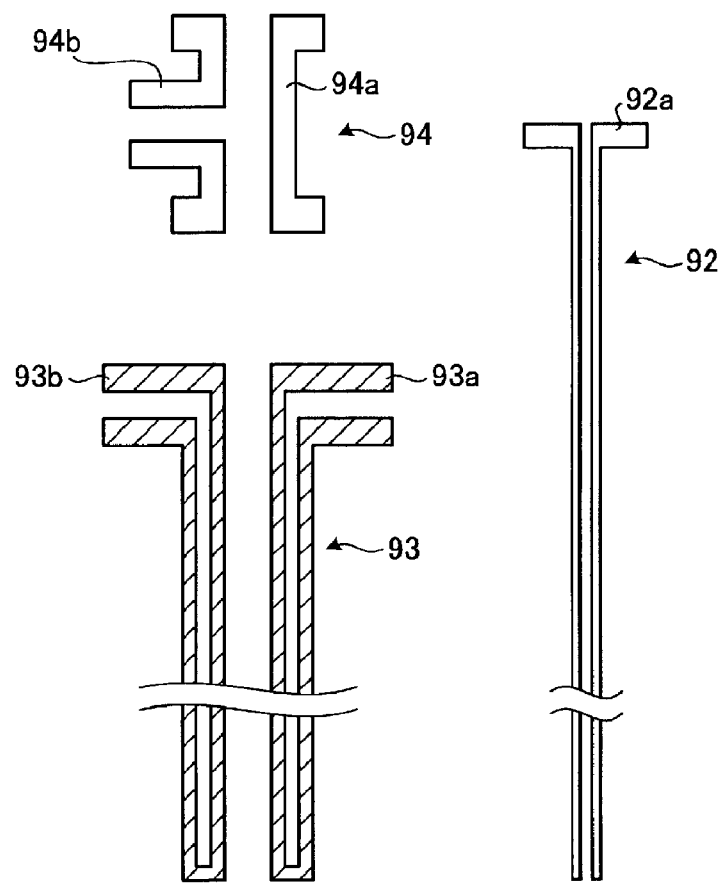
FIG. 4A is a cross-sectional view illustrating an example of a detailed configuration of a supply mechanism according to an embodiment of the present disclosure.
Figure 4B:
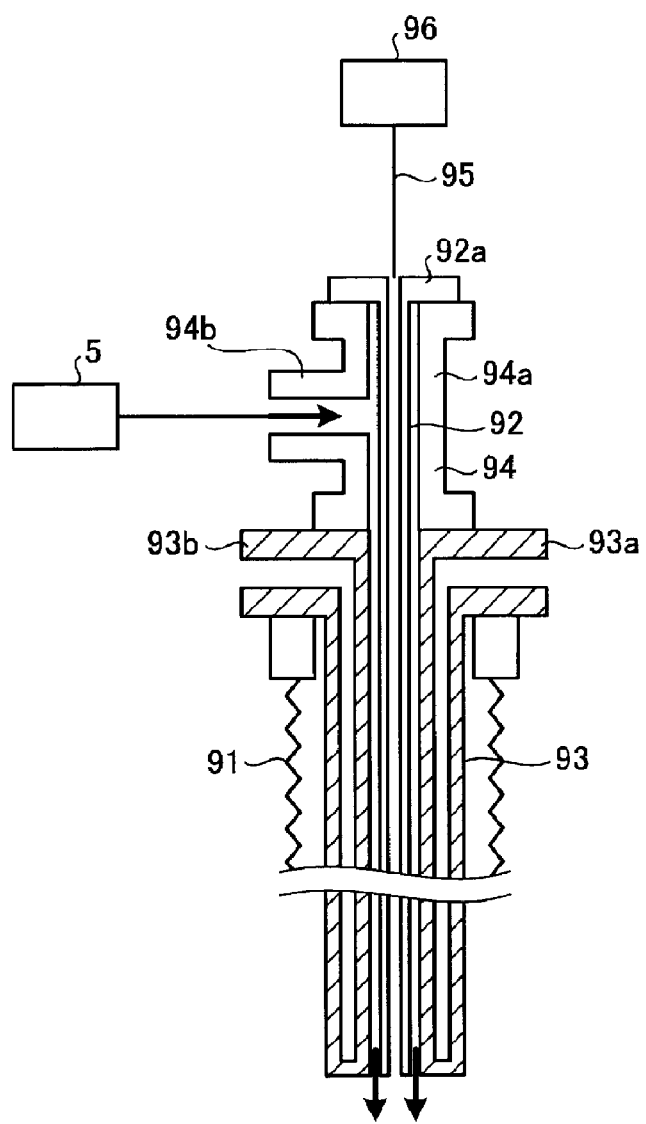
FIG. 4B is a cross-sectional view illustrating an example of a detailed configuration of the supply mechanism according to an embodiment of the present disclosure.

FIGS. 4A and 4B are cross-sectional views illustrating an example of a detailed configuration of the supply mechanism according to an embodiment of the present disclosure. FIG. 4A illustrates components constituting the supply mechanism 90. FIG. 4B illustrates a state in which the components constituting the supply mechanism 90 are combined. The supply mechanism 90 has a pipe 92, a refrigerant pipe 93, and a gas introduction part 94.

The pipe 92 is, for example, a thin pipe having a diameter of about 0.8 mm, in which the upper end and the lower end thereof are opened. A supply port 92a is provided at the upper end of the pipe 92. The liquid film-formation material is supplied from a film-formation material supply part 96 to the supply port 92a via a pipe 95. The pipe 92 transfers the liquid film-formation material supplied to the supply port 92a and discharges the same from the lower end thereof. The liquid film-formation materials include an inorganic compound and an organometallic compound. The inorganic compound may include, for example, a hydride such as $SiH_4$ or $AsH_3$, and a halide such as $SiCl_4$ or $TiCl_4$. Furthermore, the organometallic compound may include an alkoxyl compound such as TEOS ($Si(OC_2H_5)_4$), trimethylboron (TMB) or the like, an alkyl compound such as trimethyl phosphate (TMP), trimethylaluminum (TMAl) or the like, and a complex compound such as $Sr(DPM)_2$, $Bi(DPM)_3$ or the like. The liquid film-formation material may be one which forms a self-assembled monomolecular film (hereinafter, referred to as a "SAM"). The SAM is a monomolecular film formed by self-assembly of molecules. The liquid film-formation material for forming the SAM may include a liquid material containing a dielectric such as an organic silane molecule, an organic phosphoric acid molecule, an organic carboxylic acid molecule or the like.

The refrigerant pipe 93 has a double annular structure. The pipe 92 is arranged in an inner ring of the refrigerant pipe 93. An inner diameter of the inner ring of the refrigerant pipe 93 is slightly larger than that of the pipe 92, and thus a gap is formed between the inner ring and the pipe 92. The bellows 91 is arranged around the refrigerant pipe 93.

The refrigerant pipe 93 is formed such that a refrigerant such as cooling water flows between the inner ring and the outer ring. Furthermore, the refrigerant pipe 93 is formed such that a space between the inner ring and the outer ring is closed in the lower portion so that the refrigerant does not flow out from the lower portion. A refrigerant supply port 93a and a refrigerant discharge port 93b are provided in the upper portion of the refrigerant pipe 93. The refrigerant supplied to the supply port 93a flows between the inner ring and the outer ring of the refrigerant pipe 93 and is discharged from the discharge port 93b. The film forming apparatus 100 can control the temperature of the liquid flowing through the pipe 92 by changing the temperature of the refrigerant supplied to the supply port 93a. Thus, the film forming apparatus 100 can control the temperature of the liquid film-formation material flowing through the pipe 92 to a temperature suitable for film formation by controlling the temperature of the refrigerant supplied to the supply port 93*a*.

The gas introduction part 94 is provided above the refrigerant pipe 93. A pipe portion 94*a* having an inner diameter larger than that of the pipe 92 is formed in the gas introduction part 94, and the pipe 92 is arranged inside the pipe portion 94*a*. In addition, a branched branch pipe 94*b* is formed in the pipe portion 94*a*. The gas introduction part 94 is airtightly fixed to the upper portion of the refrigerant pipe 93. The branch pipe 94*b* is connected to the gas source 5 to receive a gas from the gas source 5. For example, the purge gas is supplied from the gas source 5 to the branch pipe 94*b*. The purge gas may include an $N_2$ gas, and the like. The purge gas supplied to the branch pipe 94*b* flows between the inner ring of the refrigerant pipe 93 and the refrigerant pipe 93 and is discharged from the periphery of the lower end of the pipe 92. Thus, it is possible to prevent the liquid film-formation material that has reached the lower end of the pipe 95 from being smoothly supplied to the storage part 10*a* along the flow of the purge gas and from being supplied as a large droplet at the lower end of the pipe 95.

Returning to FIG. 1, a cover member 22 made of ceramics such as alumina so as to cover the outer peripheral region of the upper surface and the side surface is provided in the stage 2. The support member 23 and an elevating mechanism 24 are provided on the bottom surface of the stage 2. The support member 23 supports the stage 2 from the center of the bottom surface of the stage 2. Furthermore, the support member 23 penetrates a hole portion formed on the bottom wall of the process vessel 1 and extends downward of the process vessel 1. The lower end of the support member 23 is connected to the elevating mechanism 24. The stage 2 is moved up and down by the elevating mechanism 24 via the support member 23. In FIG. 1, the processing positions of the stage 2 and the gas supply part 3 during film formation are indicated by solid lines, and the transfer positions where the wafer W or the vaporization substrate 10 can be transferred into and from the transfer mechanism are indicated by double-dot chain lines.

A flange portion 25 is provided below the process vessel 1 of the support member 23. A bellows 26 which divides the internal atmosphere of the process vessel 1 from the outside air and which expands and contacts with the elevating operation of the stage 2 is provided between the bottom surface of the process vessel 1 and the flange portion 25.

Three wafer support pins 27 (only two are shown) are provided near the bottom surface of the process vessel 1 so as to protrude upward from an elevating plate 27*a*. The wafer support pins 27 are raised and lowered via the elevating plate 27*a* by an elevating mechanism 28 provided below the process vessel 1.

The wafer support pins 27 are inserted into respective through-holes 2*a* formed in the stage 2 at the transfer positions and are moved up and down on the upper surface of the stage 2. By raising and lowering the wafer support pins 27, the wafer W is transferred between the transfer mechanism and the stage 2. A processing space 38 is formed between the stage 2 and the gas supply part 3 in a state in which the stage 2 exists at the processing position.

The exhaust part 4 exhausts the interior of the process vessel 1. The exhaust part 4 has an exhaust pipe 41 connected to the exhaust port 13*b*, and an exhaust mechanism 42 having a vacuum pump, a pressure control valve and the like connected to the exhaust pipe 41. During processing, the gas inside the process vessel 1 reaches the exhaust duct 13 via the slit 13*a* and is exhausted from the exhaust duct 13 via the exhaust pipe 41 by the exhaust mechanism 42.

Returning to FIG. 1, the operation of the film forming apparatus 100 configured as described above is comprehensively controlled by a controller 6. The controller 6 is, for example, a computer, and includes a central processing unit (CPU), a random access memory (RAM), a read only memory (RAM), an auxiliary storage device, and the like. The CPU controls the entire operation of the apparatus by operating based on a program stored in the ROM or the auxiliary storage device, or process conditions of plasma processing. For example, the controller 6 controls each of the supply operation of various kinds of gases from the gas source 5, the elevating operation of the elevating mechanism 24, the exhaust operation of the interior of the process vessel 1 by the exhaust mechanism 42, and the power supply from the high frequency power supply 44. Furthermore, the controller 6 controls each of the elevation operation of the elevating mechanism 55, the rotation operation of the rotary mechanism 56, the elevation operation of the elevating mechanism 57, and the power supply from the heater power supply 80. In addition, the controller 6 controls each of the elevation operation of the elevating mechanism (not shown) for moving the supply mechanism 90 up and down, the supply operation of the liquid film-formation material from the film-formation material supply part 96, and the supply of the refrigerant to the refrigerant pipe 93. A computer-readable program required for control may be stored in a storage medium. The storage medium is configured as, for example, a flexible disk, a compact disc (CD), a CD-ROM, a hard disk, a flash memory, a DVD, or the like. Furthermore, the controller 6 may be provided inside or outside the film forming apparatus 100. When the controller 6 is externally provided, the controller 6 can control the film forming apparatus 100 by a wired or wireless communication means.

Next, a flow of a film forming process executed by the film forming apparatus 100 under the control of the controller 6 will be described. FIGS. 5A to 5G are views illustrating an example of the flow of the film forming process according to an embodiment of the present disclosure.

Figure 5A:
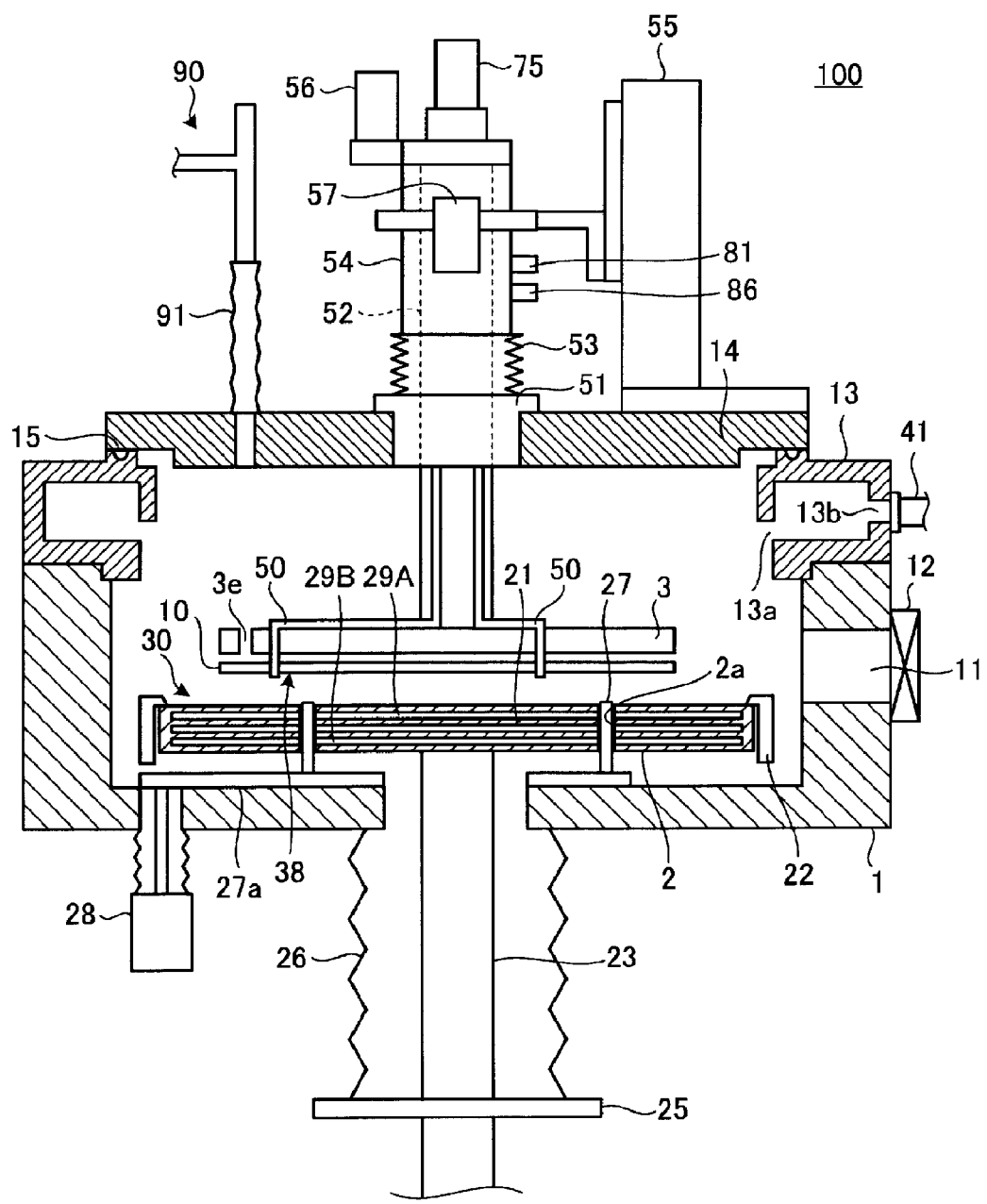
FIG. 5A is a diagram illustrating an example of a flow of a film forming process according to an embodiment of the present disclosure.
Figure 5B:
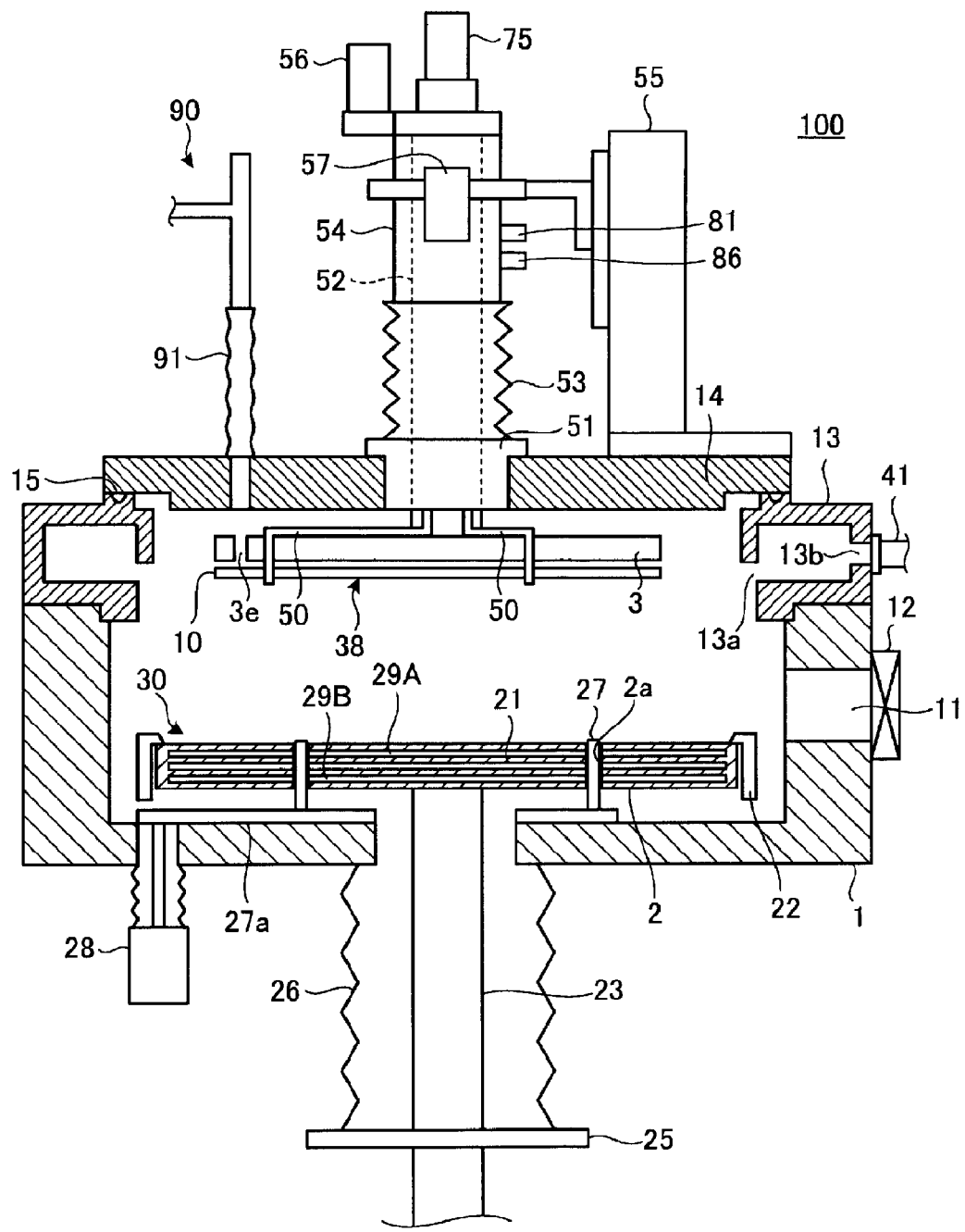
FIG. 5B is a view illustrating an example of a flow of a film forming process according to an embodiment of the present disclosure.

The film forming apparatus 100 depressurizes the interior of the process vessel 1 to a vacuum atmosphere by the exhaust mechanism 42. In the film forming apparatus 100, the vaporization substrate 10 is attached to the gas supply part 3. For example, as illustrated in FIG. 5A, the film forming apparatus 100 lowers the stage 2 to the lower portion by the elevating mechanism 24. Furthermore, the film forming apparatus 100 lowers the gas supply part 3 to the transfer position by the elevating mechanism 55. In addition, the film forming apparatus 100 contracts the rods 71*a* of the cylinders 71 to lower the support pins 50 from the gas supply part 3. Then, the film forming apparatus 100 opens the gate valve 12. In the film forming apparatus 100, the vaporization substrate 10 is loaded into between the gas supply part 3 and the support pins 50 by the transfer mechanism via the loading/unloading port 11. As illustrated in FIG. 5B, the film forming apparatus 100 raises the gas supply part 3 supported by the vaporization substrate 10 to the processing position by the elevating mechanism 55.

Furthermore, when the vaporization substrate 10 is replaced, the film forming apparatus 100 removes the vaporization substrate 10 from the gas supply part 3 and unloads the same by the transfer mechanism in the reverse flow of the flow when the vaporization substrate 10 is attached. Then, the film forming apparatus 100 loads a new vaporization substrate 10 and attaches the same to the gas supply part 3 by the transfer mechanism. Thus, the film forming apparatus 100 can easily replace the vaporization substrate 10 with the new one. Furthermore, the unloaded vaporization substrate 10 may be reused by washing.

Figure 5C:
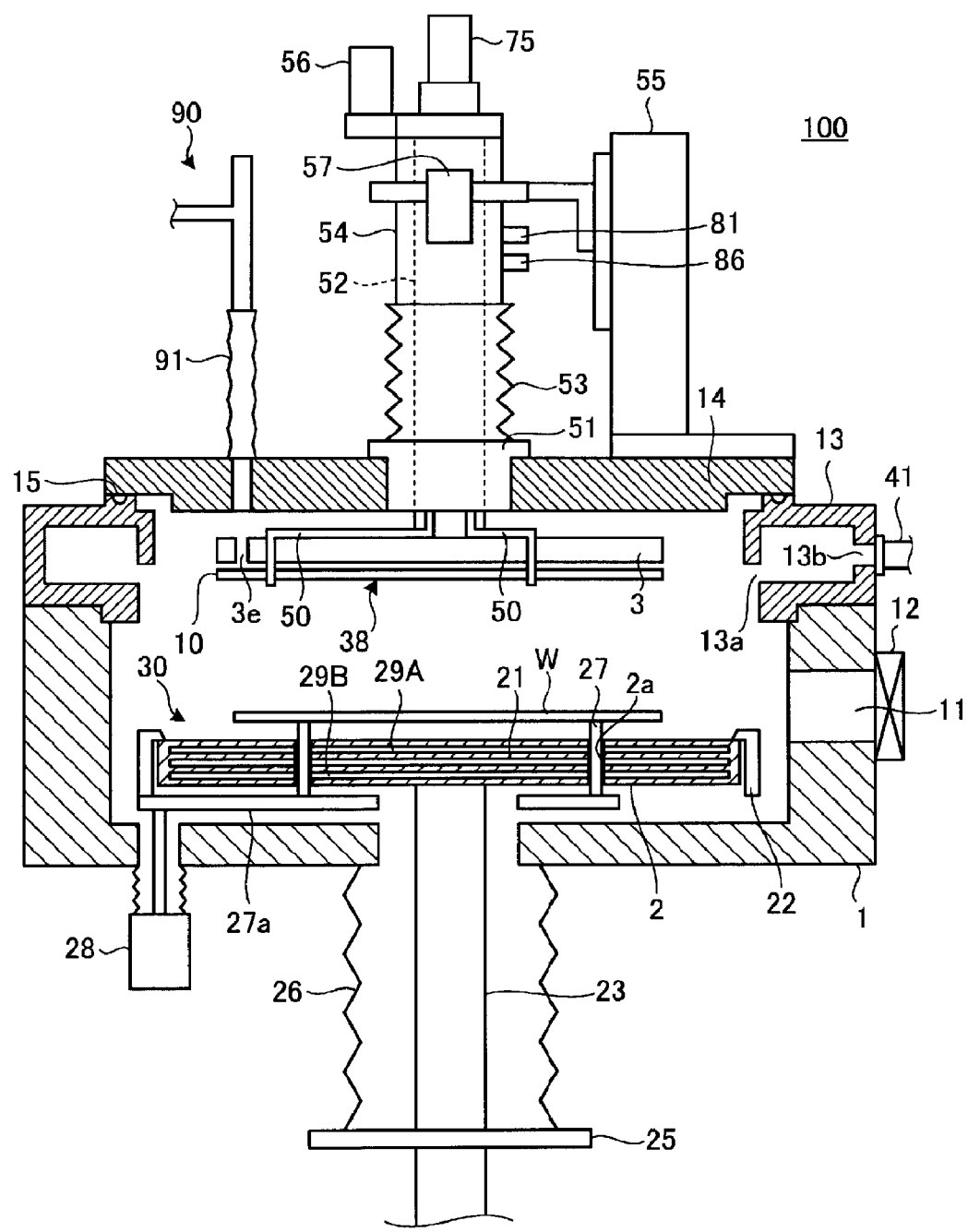
FIG. 5C is a view illustrating an example of a flow of a film forming process according to an embodiment of the present disclosure.
Figure 5D:
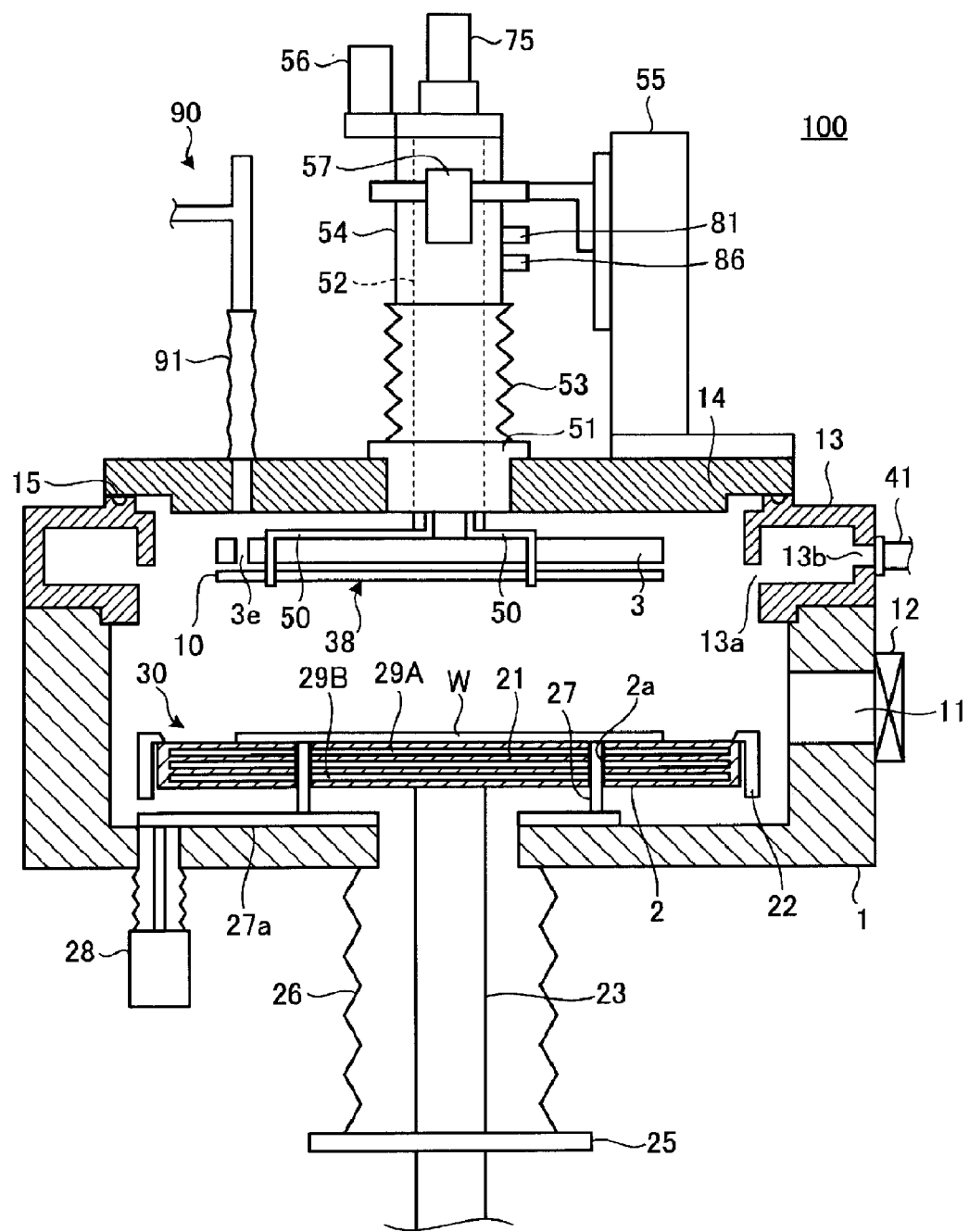
FIG. 5D is a view illustrating an example of a flow of a film forming process according to an embodiment of the present disclosure.
Figure 5E:
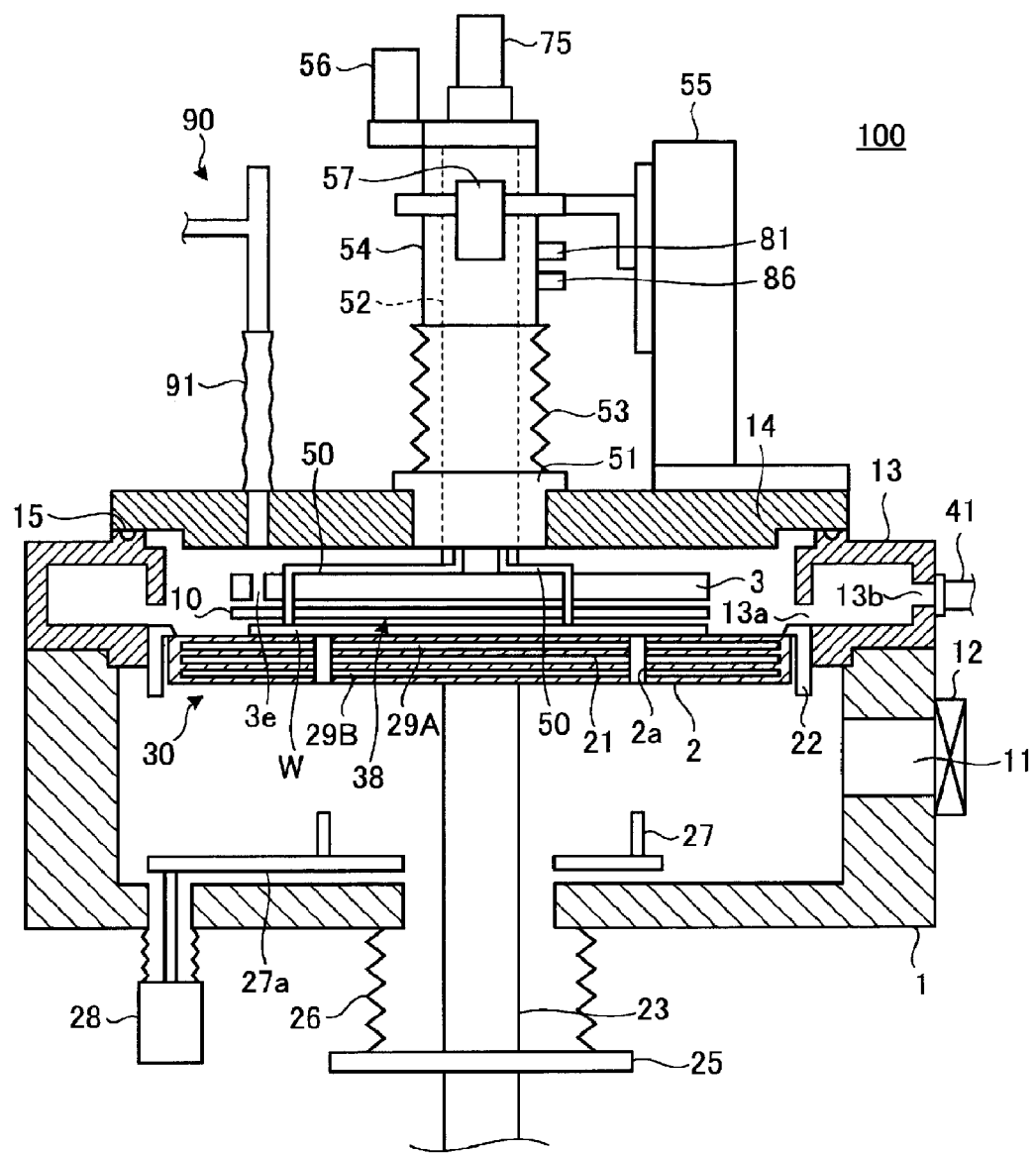
FIG. 5E is a view illustrating an example of a flow of a film forming process according to an embodiment of the present disclosure.

When film formation is performed on the wafer W, the film forming apparatus 100 arranges the wafer W on which a film is to be formed on the stage 2. For example, as illustrated in FIG. 5C, the film forming apparatus 100 lowers the stage 2 to the lower portion by the elevating mechanism 24. The wafer W on which a film is to be formed is loaded into the upper portion of the film forming apparatus 100 by the transfer mechanism via the loading/unloading port 11. The film forming apparatus 100 raises the elevating plate 27a by the elevating mechanism 28, protrudes the wafer support pins 27 from the through-holes 2a of the stage 2, and receives the wafer W by the wafer support pins 27. After the transfer mechanism is withdrawn from the loading/unloading port 11, the film forming apparatus 100 lowers the elevating plate 27a by the elevating mechanism 28 to store the wafer support pins 27 in the respective through-holes 2a of the stage 2 and then places the wafer W on the stage 2, as illustrated in FIG. 5D. Then, as illustrated in FIG. 5E, the film forming apparatus 100 raises the stage 2 to the processing position by the elevating mechanism 24.

Figure 5F:
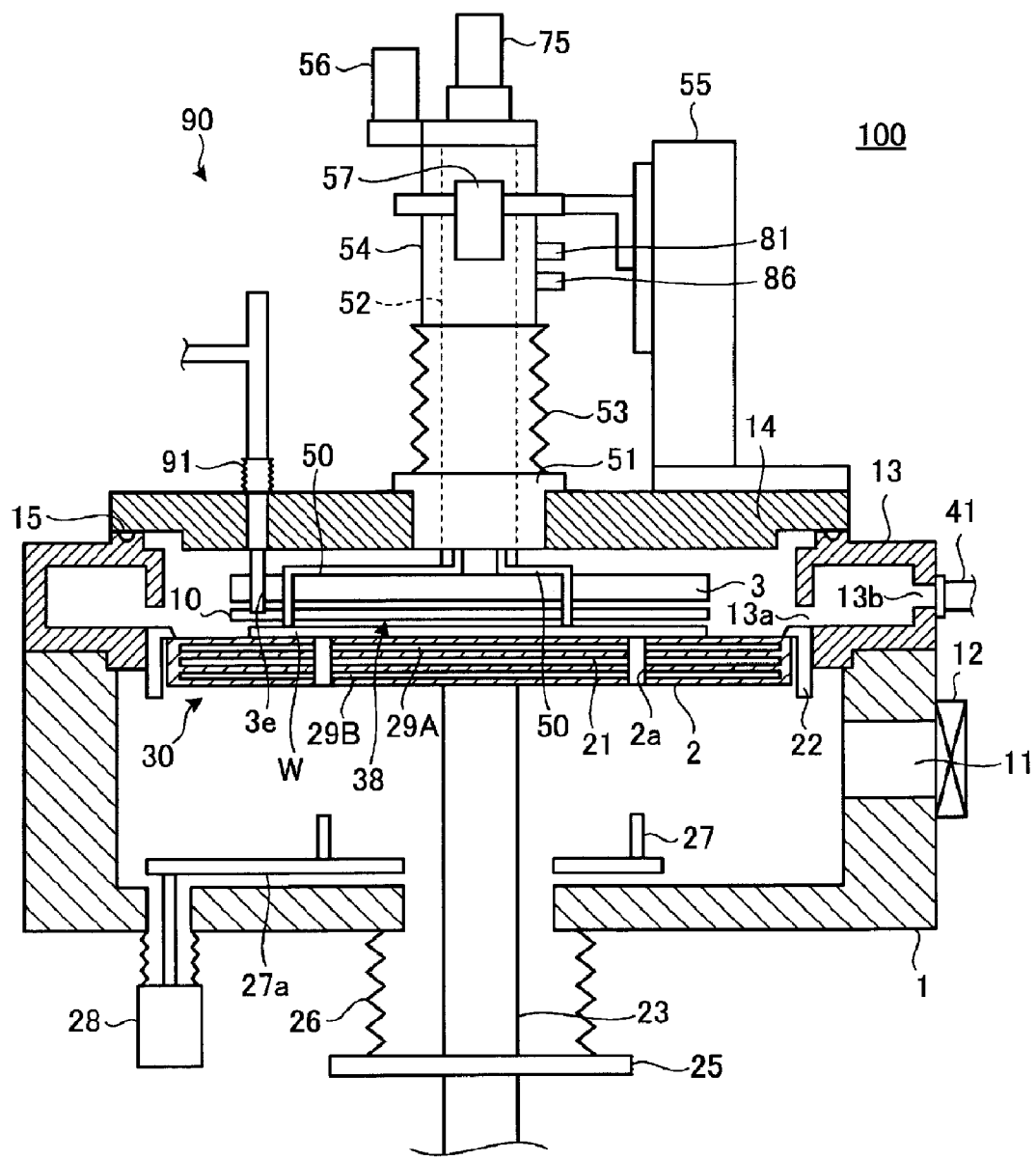
FIG. 5F is a view illustrating an example of a flow of a film forming process according to an embodiment of the present disclosure.

As illustrated in FIG. 5F, the film forming apparatus 100 lowers the supply mechanism 90 by the elevating mechanism (not shown), injects the liquid film-formation material together with the purge gas from the leading end of the supply mechanism 90, and supplies the liquid film-formation material to the storage part 10a of the vaporization substrate 10.

Figure 5G:
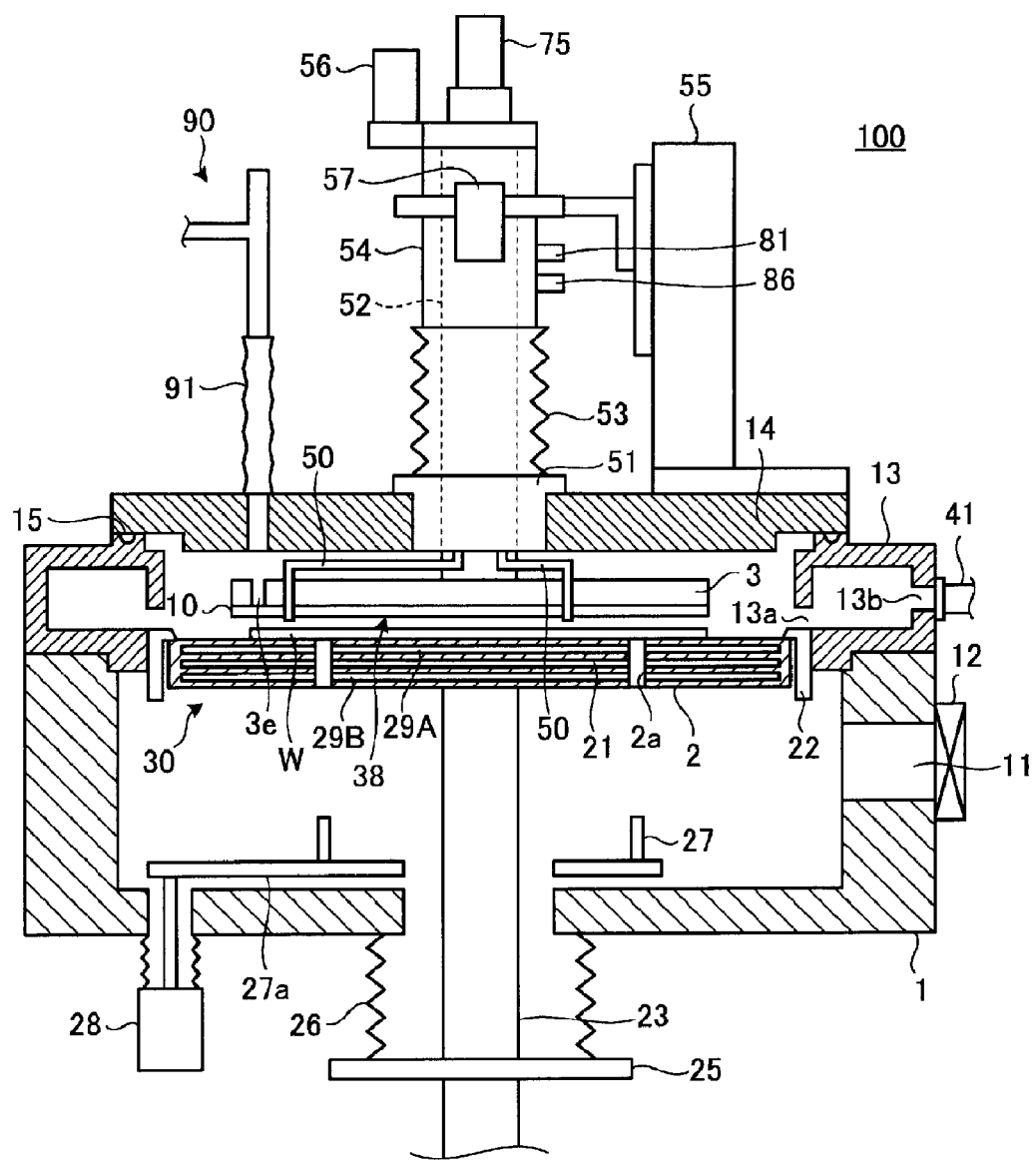
FIG. 5G is a view illustrating an example of a flow of film forming process according to an embodiment of the present disclosure.

After the supply of the film-formation material is completed, the film forming apparatus 100 raises the supply mechanism 90 by the elevating mechanism (not shown), as illustrated in FIG. 5G. The film forming apparatus 100 supplies electric power from the heater power supply 80 to the heater 3d to heat the gas supply part 3 by generating heat from the heater 3d. Furthermore, the film forming apparatus 100 measures the temperature of the gas supply part 3 by the fiber thermometer 75, and controls the electric power to be supplied from the heater power supply 80 to control the gas supply part 3 to a predetermined temperature suitable for vaporizing the film-formation material. For example, the temperature of the gas supply part 3 is controlled to any temperature in a range of 100 degrees C. to 400 degrees C. Furthermore, the film forming apparatus 100 supplies a carrier gas from the gas source 5 to the supply port 81 of the housing 54 and discharges the carrier gas from the gas supply part 3. The carrier gas may include gases having high thermal conductivity such as, e.g., hydrogen, helium, nitrogen, and the like.

Then, the film forming apparatus 100 expands the rods 71a of the cylinders 71, raises the support pins 50, and brings the vaporization substrate 10 into contact with the gas supply part 3 to be fixed to the gas supply part 3. Furthermore, the film forming apparatus 100 rotates the shaft 52 in the circumferential direction by the rotary mechanism 56 and rotates the gas supply part 3 around the shaft 52 as the rotary shaft.

Thus, in the film forming apparatus 100, the film-formation material stored in the storage part 10a is vaporized by the heat of the gas supply part 3. Then, in the film forming apparatus 100, the vaporized film-formation material gas flows on the wafer W by the carrier gas flowing from the gas supply part 3 to form a film on the wafer W. In the present disclosure, the film forming apparatus 100 rotates the gas supply part 3 during film formation. Therefore, since the film-formation material gas is uniformly supplied to the wafer W, it is possible to uniformly form a film on the wafer W.

As described above, the film forming apparatus 100 according to the present embodiment includes the stage 2, the gas supply part 3, and the vaporization substrate 10. The wafer W on which a film is to be formed is arranged on the stage 2. The gas supply part 3 is arranged so as to face the stage 2, and is provided with the heater 3d controlled to a predetermined temperature to supply the carrier gas. The vaporization substrate 10 is arranged between the stage 2 and the gas supply part 3, and is heated by the heat from the gas supply part 3 to vaporize the film-formation material supplied in a liquid state. Thus, the film forming apparatus 100 can vaporize the liquid film-formation material at a position closer to the wafer W to form a film. Furthermore, the film forming apparatus 100 can supply the vaporized film-formation material gas from the upper side of the wafer W to form a film.

In addition, the vaporization substrate 10 is arranged so as to face the surface of the gas supply part 3 on the side of the stage 2. Furthermore, the film forming apparatus 100 has the elevating mechanism 57 which raises and lowers the vaporization substrate 10 with respect to the gas supply part 3. Therefore, since the film forming apparatus 100 can adjust the heat radiated from the gas supply part 3 to the vaporization substrate 10 by raising and lowering the vaporization substrate 10 with respect to the gas supply part 3, it is possible to control the vaporization of the film-formation material.

Furthermore, the plurality of injection holes 3c for injecting the carrier gas are formed in the gas supply part 3. The through-holes 10c are formed in the vaporization substrate 10 at the positions corresponding to the injection holes 3c. Therefore, since the film forming apparatus 100 can flow a large amount of vaporized film-formation material gas through the wafer W by the flow of the carrier gas, it is possible to improve the film formation efficiency on the wafer W.

In addition, the film forming apparatus 100 includes the elevating mechanism 55 which raises and lowers the gas supply part 3, and the support pins 50 which detachably supports the vaporization substrate 10 to the gas supply part 3. The vaporization substrate 10 has the same shape as the wafer W and is transferred using the transfer mechanism which transfers the wafer W to the stage 2. The elevating mechanism 55 lowers the gas supply part 3 to the transfer position where the wafer W is transferred to the stage 2. The support pins 50 support the vaporization substrate 10 transferred by the transfer mechanism. Thus, the film forming apparatus 100 can attach and detach the vaporization substrate 10 by using the transfer mechanism which transfers the wafer W to the stage 2.

Furthermore, the film forming apparatus 100 further includes the rotary mechanism 56 which rotates the gas supply part 3 on the rotary shaft perpendicular to the stage 2 during the film forming process. Thus, the film forming apparatus 100 can uniformly supply the vaporized film-formation material gas to the wafer W to form a film.

Furthermore, the storage part 10a for storing the film-formation material supplied in a liquid state is provided in the vaporization substrate 10. The film forming apparatus 100 further includes the supply mechanism 90 which supplies the liquid film-formation material to the storage part 10a. Thus, the film forming apparatus 100 can supply the film-formation material supplied in a liquid state to the vaporization substrate 10 to form a film.

The supply mechanism 90 includes the refrigerant pipe 93 through which the refrigerant flows and provided around the pipe 92 through which the liquid film-formation material flows. The film-formation material is discharged together with the purge gas from the leading end of the pipe 92 which supplies the film-formation material to the storage part 10*a*. Thus, the film forming apparatus 100 can smoothly supply the liquid film-formation material to the storage part 10*a*.

Although the embodiment has been described above, it should be noted that the embodiment disclosed herein are exemplary in all respects and are not restrictive. Indeed, the aforementioned embodiment may be embodied in a variety of forms. Moreover, the above-described embodiment may be omitted, replaced or modified in various forms without departing from the scope and spirit of the accompanying claims.

For example, in the embodiment, there has been described the case where the gas supply part 3 is rotated during film formation as an example, but the present disclosure is not limited thereto. The stage 2 may be rotated.

Furthermore, in the embodiment, there has been described as an example the case where the liquid film-formation material is vaporized by bringing the vaporization substrate 10 into contact with the gas supply part 3, but the present disclosure is not limited thereto. For example, the liquid film-formation material may be vaporized with the vaporization substrate 10 separated from the gas supply part 3.

Moreover, in the embodiment, there has been described the case where one gas flow path 3*b* is formed in the entire gas supply part 3 as an example, but the present disclosure is not limited thereto. For example, the gas flow path 3*b* of the gas supply part 3 may be divided into a plurality of portions, and a gas may be individually supplied to the wafer W for each of divided regions into which the lower surface 3*a* of the gas supply part 3 is divided. Furthermore, the gas supply paths such as the gas flow path 85, the recess 82, and the supply port 81 may be individually formed in the shaft 52 and the housing 54 for each of the gas flow paths 3*b*.

In addition, in the embodiment, there has been described the case where one heater 3*d* is provided in the entire gas supply part 3 as an example, but the present disclosure is not limited thereto. For example, the heater 3*d* of the gas supply part 3 is divided into a plurality of portions, and the temperature of the lower surface 3*a* of the gas supply part 3 may be adjusted individually for each divided region. Furthermore, the power feeding paths such as the power feeding wire 88, the conductive part 87, and the power feeding terminal 86 may be individually formed in the shaft 52 and the housing 54 for each heater 3*d*.

Furthermore, in the embodiment, there has been described as an example the case where the supply port 81 and the power feeding wire 88 are provided in the housing 54 so as to supply a gas or electric power from the side surface, but the present disclosure is not limited thereto. For example, the gas or the electric power may be supplied via the through-holes formed in the rotary shaft of the shaft 52.

Furthermore, in the embodiment, there has been described the case where the vaporization substrate 10 has the same shape as the wafer W as an example, but the present disclosure is not limited thereto. For example, the vaporization substrate 10 may have a shape larger than that of the wafer W, and the loading/unloading port for the vaporization substrate 10 may be provided in the film forming apparatus 100.

Furthermore, in the embodiment, there has been described the case where the storage part 10*a* is provided in a portion of the vaporization substrate 10 as an example, but the present disclosure is not limited thereto. For example, the entire vaporization substrate 10 may be formed as a member through which a gas can pass while storing a liquid, such as a sintered metal, a nylon filter, a porous member, or a porous metal.

Moreover, in the embodiment, there has been described the case where the workpiece is a semiconductor wafer as an example, but the present disclosure is not limited thereto. The workpiece may be another substrate such as a glass substrate or the like.

EXPLANATION OF REFERENCE NUMERALS

1: process vessel, 2: stage, 3: gas supply part, 3*b*: gas flow path, 3*c*: injection hole, 3*d*: heater, 3*e*: through-hole, 5: gas source, 6: controller, 10: vaporization substrate, 10*a*: storage part, 10*c*: through-hole, 24: elevating mechanism, 50: support pin, 52: shaft, 53: bellows, 54: housing, 55: elevating mechanism, 55*a*: arm, 56: rotary mechanism, 57: elevating mechanism: 60: upper shaft member, 63: pulley, 64: belt, 70: elevating component, 70*a*: disk member, 70*b*: holder part, 70*c*: bearing, 71: cylinder, 71*a*: rod, 72: pole, 80: heater power supply, 81: supply port, 82: recess, 85: gas flow path, 86: power feeding terminal, 87: conductive part, 88: power feeding wire, 90: supply mechanism, 91: bellows, 92: pipe, 92*a*: supply port, 93: refrigerant pipe, 93*a*: supply port, 93*b*: discharge port, 94: gas introduction part, 94*b*: branch pipe, 96: film-formation material supply part, 100: film forming apparatus, W: wafer

What is claimed is:

1. A film forming apparatus, comprising:
   a stage on which a workpiece on which a film is to be formed is placed;
   a gas supplier provided so as to face the stage, including a heater provided to be controlled to a predetermined temperature, and configured to supply a carrier gas;
   a vaporizer provided between the stage and the gas supplier so as to face a surface of the gas supplier which faces the stage, including a storage configured to store a film-formation material supplied in a liquid state, and configured to be heated by heat generated from the gas supplier to vaporize the film-formation material supplied in the liquid state; and
   a first elevator configured to raise and lower the vaporizer with respect to the gas supplier between a first position at which the film-formation material supplied in the liquid state is supplied to the storage and a second position at which the film-formation material supplied in the liquid state is vaporized.

2. The film forming apparatus of claim 1, wherein the gas supplier has a plurality of injection holes formed to inject the carrier gas therethrough, and
   the vaporizer has through-holes formed at positions corresponding to the plurality of injection holes.

3. The film forming apparatus of claim 1, further comprising:
   a second elevator configured to raise and lower the gas supplier; and
   a support configured to detachably support the vaporizer to the gas supplier,
   wherein the vaporizer has the same shape as that of the workpiece, and is transferred by a transfer mechanism configured to transfer the workpiece to the stage, and the gas supplier is lowered to a transfer position where the workpiece is transferred to the stage by the second elevator such that the vaporizer transferred by the transfer mechanism is supported by the support.

4. The film forming apparatus of claim 1, further comprising: a rotary mechanism configured to rotate the gas supplier on a rotary shaft perpendicular to the stage during a film forming process.

5. The film forming apparatus of claim 1, further comprising: a supply mechanism configured to supply the film-formation material supplied in the liquid state to the storage.

6. The film forming apparatus of claim 5, wherein the supply mechanism includes a second pipe through which a refrigerant flows and provided around a first pipe through which the film-formation material remaining in the liquid state flows, and the film-formation material is discharged together with a purge gas from a leading end portion of the first pipe configured to supply the film-formation material to the storage.

* * * * *